(12) United States Patent
Spehlmann et al.

(10) Patent No.: US 10,451,653 B2
(45) Date of Patent: Oct. 22, 2019

(54) CONTROLLING A PER-PIN MEASUREMENT UNIT

(71) Applicant: Teradyne, Inc., North Reading, MA (US)

(72) Inventors: Marc Spehlmann, North Reading, MA (US); John J. Keough, Malden, MA (US); Marc Hutner, Toronto (CA)

(73) Assignee: Teradyne, Inc., North Reading, MA (US)

( * ) Notice: Subject to any disclaimer, the term of this patent is extended or adjusted under 35 U.S.C. 154(b) by 20 days.

(21) Appl. No.: 14/577,687

(22) Filed: Dec. 19, 2014

(65) Prior Publication Data

US 2016/0178667 A1 Jun. 23, 2016

(51) Int. Cl.
*G01R 1/073* (2006.01)
*G01R 31/26* (2014.01)
*G01R 31/28* (2006.01)

(52) U.S. Cl.
CPC ......... *G01R 1/073* (2013.01); *G01R 31/2601* (2013.01); *G01R 31/2834* (2013.01)

(58) Field of Classification Search
CPC ............................ G01R 31/2601; G01R 1/073
See application file for complete search history.

(56) References Cited

U.S. PATENT DOCUMENTS

| | | | | |
|---|---|---|---|---|
| 5,127,011 A * | 6/1992 | Combs | ............ | G01R 31/31713 714/724 |
| 2002/0070725 A1 | 6/2002 | Hilliges | | |
| 2005/0246603 A1 | 11/2005 | Rottacker et al. | | |
| 2006/0069967 A1 * | 3/2006 | Almy | ............... | G01R 31/31932 714/724 |
| 2006/0202707 A1 | 9/2006 | Harjung | | |
| 2006/0273811 A1 * | 12/2006 | Haigh | ............... | G01R 31/31924 324/537 |
| 2007/0024291 A1 * | 2/2007 | Persons | ............ | G01R 31/31924 324/713 |
| 2007/0168817 A1 | 7/2007 | Viens | | |
| 2011/0276302 A1 * | 11/2011 | Rivoir | ............. | G01R 31/31908 702/117 |

FOREIGN PATENT DOCUMENTS

WO    WO-2016/099783 A1    6/2016

OTHER PUBLICATIONS

International Search Report for PCT/US2015/061502, 3 pages (dated Mar. 28, 2016).
Written Opinion for PCT/US2015/061502, 7 pages (dated Mar. 28, 2016).
Office Action in Chinese counterpart application dated Jun. 18, 2019 (Chinese-language version; concise statement of relevance in accompanying transmittal).

* cited by examiner

*Primary Examiner* — Patrick Assouad
*Assistant Examiner* — Haidong Zhang
(74) *Attorney, Agent, or Firm* — Burns & Levinson LLP

(57) ABSTRACT

Example automatic test equipment (ATE) includes: a per-pin measurement unit (PPMU); logic configured to execute a state machine to control the PPMU; memory that is part of, or separate from, the logic; and a control system to command the logic; where, in response to a command from the control system, the state machine is configured to obtain, at a known interval or ATE event, data that is based on an output of a measurement by the PPMU and to store the data in the memory, or to output data to the PPMU from the memory at a known interval or synchronous to an event.

17 Claims, 2 Drawing Sheets

CONTROLLING A PER-PIN MEASUREMENT UNIT

TECHNICAL FIELD

This specification relates generally to controlling a per-pin measurement unit (PPMU) that is part of automatic test equipment (ATE).

BACKGROUND

Automatic Test Equipment (ATE) refers to an automated, usually computer-driven, system for testing devices, such as semiconductors, electronic circuits, and printed circuit board assemblies. Devices tested by ATE are referred to as devices under test (DUT). ATE includes a per-pin measurement unit (PPMU). In some ATE, the PPMU is configured to receive analog signals from a DUT, and to output analog signals to the DUT as part of a test process.

SUMMARY

Example automatic test equipment (ATE) comprises: a per-pin measurement unit (PPMU); logic configured to run a state machine to control the PPMU; memory that is part of, or separate from, the logic; and a control system to command the logic; where, in response to a command from the control system, the state machine is configured to obtain, at a known interval or in synchronous to an event, data that is based on an output of a measurement by the PPMU and to store the data in the memory, or to output data to the PPMU from the memory at a known interval or synchronous to an event. The example ATE may include one or more of the following features, either alone or in combination.

The ATE may be configured to test a device under test (DUT), the DUT having multiple pins. The ATE may be configured to obtain, via the PPMU, data that is based on values at a single pin of the DUT and to store the data in the memory.

The ATE may be configured to test a DUT having multiple pins. The ATE may be configured to obtain, via the PPMU, data that is based on values at multiple pins of the DUT and to store the data in the memory. The known intervals may be programmable.

The ATE may comprise: an analog-to-digital converter (ADC) between the logic and the PPMU, the ADC for servicing one or multiple PPMUs including the PPMU; where the logic is configured to obtain the data by retrieving the data from the ADC. The ATE may be configured to test a DUT having multiple pins; where: the ATE is configured to obtain, via the PPMU, data that is based on values at a single pin of the DUT and to store the data in the memory; the logic is configured to provide the data to the control system; and the control system is configured to reconstruct a waveform based on the data.

The ATE may be configured to test a DUT having multiple pins; where the ATE is configured to obtain, via the PPMU, data that is based on values at a single pin of the DUT and to store the data in the memory; wherein the data is usable to perform one or more operations comprising measuring signal noise or extracting signal peak amplitude.

The ATE may be configured to output a digital pattern to the DUT, the digital pattern containing control data; and the ATE may be configured to use the control data to control the logic based on the control data. The ATE may be configured to control when the logic obtains data that is based on an output of the PPMU, or outputs data to the PPMU from the memory. The ATE may be configured to control the logic to obtain data at a time that is based on the control data.

The ATE may comprise a processing device that is responsive to the control system to control operation of the logic. The logic may comprise a field programmable gate array (FPGA); where the ATE comprises multiple FPGAs, each of the multiple FPGAs being configured to run a state machine to control one or more PPMUs; and wherein the processing device is configured to control the multiple FPGAs.

The PPMU may comprise a digital-to-analog converter and the memory stores signal data; and the logic may be configured to send the signal data to the memory, and the PPMU is configured to generate an AC waveform for delivery to the DUT based on the signal data.

The AC waveform may be an analog waveform.

The PPMU may be configurable to measure or to source a current waveform, or to measure or source a voltage waveform.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Manufacturers may test devices at various stages of manufacturing. Manufacturers have an economic incentive to detect and discard faulty components as early as possible in the manufacturing process. Accordingly, many manufacturers test integrated circuits at the wafer level, before a wafer is cut into dice. Defective circuits are marked and generally discarded prior to packaging, thus saving the cost of packaging defective dice. As a final check, many manufacturers test each finished product before it is shipped. Such a process tests parts in packages which have had additional expense added to them over bare die. So, having accurate test results reduces the need to discard valuable parts.

To test quantities of components, manufacturers commonly use ATE (or "testers"). In response to instructions in a test program set (TPS), some ATE automatically generates input signals to be applied to a device under test (DUT), and monitors output signals. The ATE compares the output signals with expected responses to determine whether the DUT is defective. ATE typically includes a computer system and a test instrument or a single device having corresponding functionalities. In some cases, the test instrument provides power to a DUT.

Figure 1:
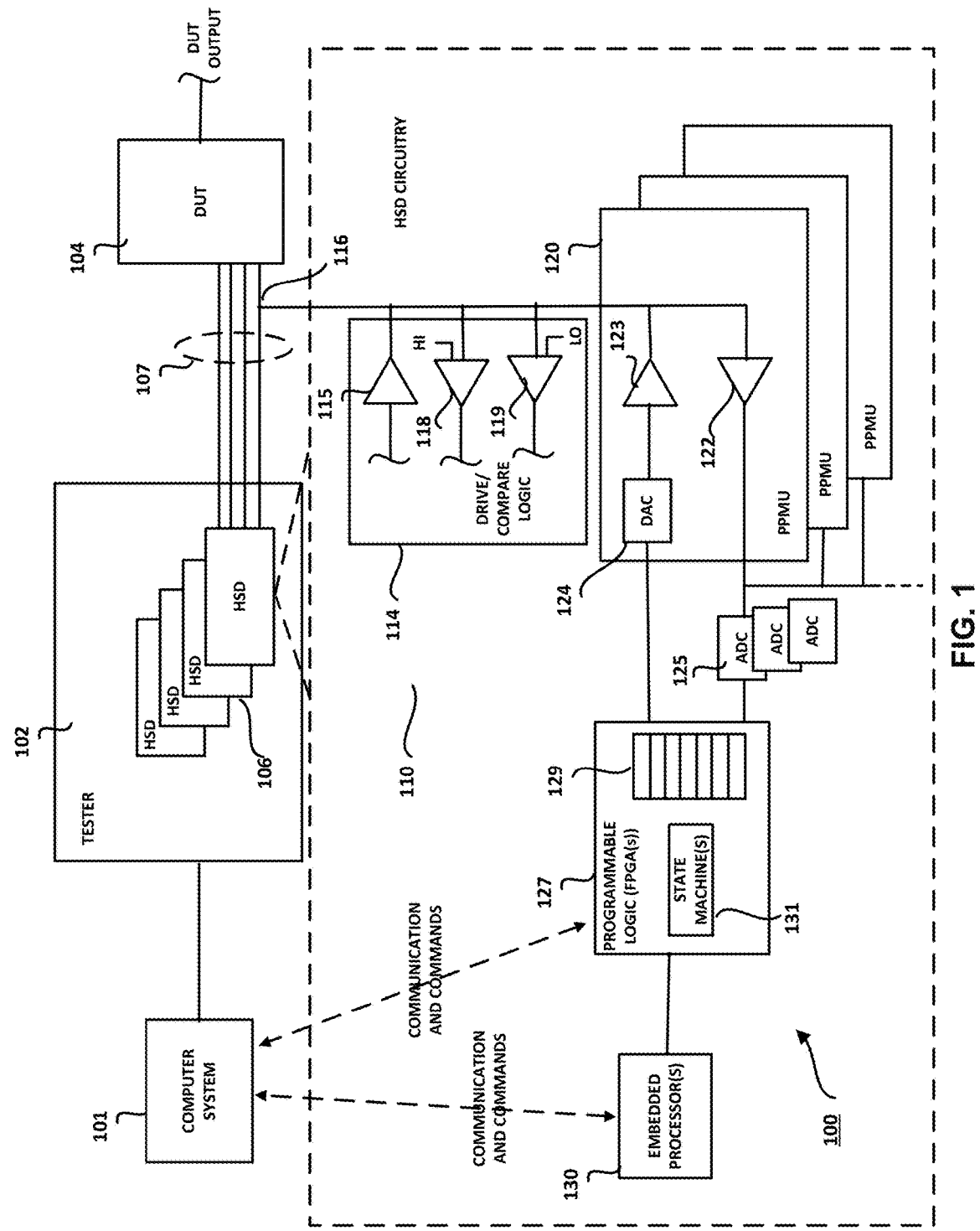
FIG. 1 is a block diagram of example circuitry in automatic test equipment (ATE), including example per-pin measurement unit (PPMU) circuitry.

FIG. 1 shows example components of an example ATE 100. These components include a computer system 101 and a tester 102. In some examples, computer system 101 controls operations of tester 102, and receives data from tester 102 for further processing. Tester 102 interfaces to DUT 104, either directly or indirectly (e.g., through a device interface board (DIB) (not shown)). In this example, tester 102 communicates data to, and receives test data from, DUT 104. For example, as described with respect to FIG. 2 below, tester 102 sends test data to DUT 104, and analyzes the DUT's response to that test data in order to determine if the DUT is operating correctly or within acceptable operational parameters. In some implementations, tester 102 includes circuitry called high-speed digital instruments (HSDs) 106, which are shown in FIG. 1. HSDs have one or more circuits known as channels. DUTs have one or more pins which they use to connect to other circuitry. HSD channels may be connected to DUT pins to provide communication between and HSD instruments and the DUT.

In an example, each HSD 106 includes circuitry to provide digital data, also referred to as digital "test patterns", to a DUT. These test patterns may be designed to elicit particular responses from the DUT. The DUT's reaction to these test patterns is captured by the ATE in order to determine if the DUT has passed, or failed, a test that is based on the test pattern. Communications occur between each HSD channel 107 and corresponding DUT pin. Although only several communication channels 107 are shown, there are typically more communication channels than are shown in the figure. In an example implementation, there may be one DUT pin per HSD channel. The number of signals between the ATE and the DUT may vary depending upon the circumstances; however, that number may reach into the hundreds or thousands in some cases.

In some examples, each HSD may include circuitry on each channel to detect signals on the channel, and to output signals to the channel. An example of this circuitry 110 is shown in FIG. 1. In some implementations, this circuitry, or portion(s) thereof, is included in the tester but not in an HSD. In this example, circuitry 110 includes a digital drive and compare unit 114. Digital drive and compare unit 114 includes a driver 115 for driving digital signals on a channel 116 to the DUT, comparators 118, 119 having respective low and high inputs for digital signals. In this example, circuitry 110 also includes one or more per-pin measurement units (PPMU). Any appropriate number of PPMUs may be included. PPMUs can be used to measure parametric, or analog, qualities of a DUT pin or to source parametric or analog signals to the DUT. PPMUs may be capable of sourcing and measuring both voltages and currents.

Example PPMU 120 may be configured to receive signals from the DUT or to source signals to the DUT. In this example, PPMU 120 includes an analog input 122, an analog output 123, and a digital-to-analog converter (DAC) 124 connected to the analog output. In some implementations, there may be multiple PPMUs, as shown. In some examples, the PPMUs may include different, substitute, and/or additional circuitry than that shown. In this example, an analog-to-digital converter (ADC) 125 receives analog signals measured by the PPMU from the DUT, and converts those signals to digital form. In some implementations, a single ADC serves multiple PPMUs (as shown); however, that is not a requirement. DACs and ADCs may be integrated into PPMUs or may be independent components.

Programmable logic 127—in this example, a field programmable gate array (FPGA)—is connected to both ADC 125 and to DAC 124. In some implementations, programmable logic 127 may be replaced by, or augmented by, other appropriate logic and/or circuitry, such as an application-specific integrated circuit (ASIC) or other processing devices. In addition, there may be multiple such devices. In some examples, programmable logic 127 is part of an HSD (as shown), whereas in other examples programmable logic 127 is resident elsewhere on the tester or system.

In this example, programmable logic 127 implements a processing device and memory. In other implementations the memory may be external to the processing device, or the memory may be part internal to the logic and part external, or entirely external to the logic. In this example, the processing device is used to execute one or more state machines 131. In this example, a state machine implemented by the programmable logic interacts with one or more ADCs, such as ADC 125. A state machine may also be responsive to one or more commands output by computer system 101. For example, in response to a command (e.g., a single command) or other instruction from computer system 101, the state machine may retrieve (e.g., read or request and receive) data from one or more ADCs. The data may represent outputs of PPMU 120 and, therefore, may represent measurements generated by the PPMU.

By providing a state machine to control interaction with the PPMUs, the example ATE described herein is able, through the PPMUs, to retrieve data at fixed, known, or programmable intervals, and to source data at fixed, known, or programmable intervals. For example, the state machine running in the programmable logic may be dedicated to tasks of obtaining and sourcing data (in contrast to the computer system, which also performs other tasks). As a result, in some cases, the state machine is able to maintain more precise timing than the computer system for data retrieval and sourcing. Furthermore, in some implementations, the state machine may be responsive to a single command of the computer system. Therefore, once the state machine receives that command, control over data retrieval or sourcing is passed to the state machine, which can perform those operations at fixed, known, or programmable intervals. The fixed, known, or programmable intervals may be hard-coded or programmable.

In some implementations, the state machine may be configured to obtain data from multiple DUT channels. For example, the state machine may be configured to obtain data from different channels by communicating with ADCs connected to PPMUs for those channels. In an example, the ADC may request, in sequence, data from each channel, and then repeat this request as instructed. The data may be stored, in sequence, in locations of memory 129 in the programmable logic. In some implementations, the state machine may be configured to obtain data from a single DUT pin by communicating with an ADC connected to a PPMU for the corresponding channel. For example, the state machine may be configured to obtain, at a known intervals, data that is based on an output of a measurement by PPMU 120 and to store the data in memory on the programmable logic (or, in some implementations, to output data to the PPMU from the memory at a known intervals). For example, the state machine may read data from ADC 125 at known intervals (e.g., every 8 milliseconds) to obtain a reading that corresponds to a waveform at the DUT. This data may be stored, in sequence, in memory. Accordingly, effectively, the PPMU may be used to sample a signal at a DUT pin at known intervals. The data stored in memory 129 may be used to reconstruct the waveform at the DUT, to measure noise in the signal, to determine a peak amplitude of the signal, and/or to determine any other appropriate parameters relating to the DUT signal that can be ascertained based on the data. In some implementations, the data may be transferred to computer system 101, and computer system 101 may perform the processing used to reconstruct the waveform at the DUT, to measure noise in the signal, to determine a peak amplitude of the signal, etc. In other implementations, this processing may be performed in the programmable logic or in an embedded processor 130 in the tester.

In some implementations, memory 129 is used both to store digitized ADC data and source DAC data. In some implementations, pattern data to output to the PPMU DACs may reside externally to memory 129, while capture memory may be integrated into the PPMU.

In some implementations, the foregoing circuitry may be used to sample signals at multiple DUT pins. For example, to sample signals at two DUT pins, the state machine may obtain data, alternately or simultaneously, from two different PPMUs connected to those two channels corresponding to those DUT pins. The obtained data may be stored in memory (e.g., for each DUT pin, at every other memory location), and used to reconstruct the two signals or to perform any other appropriate processing associated therewith. This concept may be extended to any number of channels, pins and signals.

As noted above, in some implementations, the PPMU may be operated as a source for data to the DUT. For example, the state machine may read-out, at known intervals, data from memory 129 and output that data to DAC 124. The DAC may generate an analog signal based on the data, and output the analog signal to a DUT pin 116. Thus, the programmable logic may be configured to send signal data from the memory, and the PPMU may be configured to generate an AC (e.g., a low-frequency analog) waveform for delivery to the DUT based on the signal data.

As noted above, data may be read from the ADC at a fixed, known, or programmable intervals, or supplied to the DAC at a fixed, known, or programmable intervals, by the state machine. In some implementations, the fixed, known, or programmable intervals may be programmed, by the computer system, into the state machine. In some implementations, that fixed, known, or intervals may be changeable or not changeable.

In some implementations, ATE 100 may include multiple programmable logic devices (e.g., multiple FPGAs), each of which may be configured to serve multiple PPMUs and to run a state machine of the type described above. An embedded processor 130 may be programmed to control and/or coordinate operations of the various programmable logic devices. The embedded processor 130 may be controlled/programmed by commands provided from computer system 101. In some implementations, there may be multiple embedded processors included in ATE. Since the embedded processors may be dedicated devices, timing control over the programmable logic may be maintained within appropriate tolerances. In some examples, the embedded processor(s) are part of one or more HSDs (as shown), whereas in other examples the embedded processor(s) are resident elsewhere on the tester or system.

In some implementations, sampling a signal at a DUT pin is not synchronized to any particular timing. For example, the time at which the data may be sampled is not known beforehand, thereby obtaining a sampling of an unspecified interval of a signal. In some implementations, control data in the test pattern, or sent along with the test pattern, may be used to synchronize sampling of data from a DUT, or providing signals to the DUT. For example, the control data may be sent from the HSDs, or elsewhere, to the programmable logic. The programmable logic may use the control data to synchronize sampling of DUT data with data output to the DUT, thereby enabling signals at DUT (input or output) to be sampled at a known time. IN this regard, the programmable logic may use the control data to synchronize the state machine with any appropriate ATE events/operations.

As noted above, the example techniques described herein may be implemented, at least in part, on ATE. In an example operation, ATE (also referred to as "testers" or "test systems") operates in accordance with instructions in a test program set (TPS) to automatically generate input signals to be applied to a DUT, and to monitor output signals from the DUT. The ATE compares the output signals with expected responses to determine whether the DUT is defective. ATE typically includes a computer system and a test instrument or a single device having corresponding functionalities.

Figure 2:
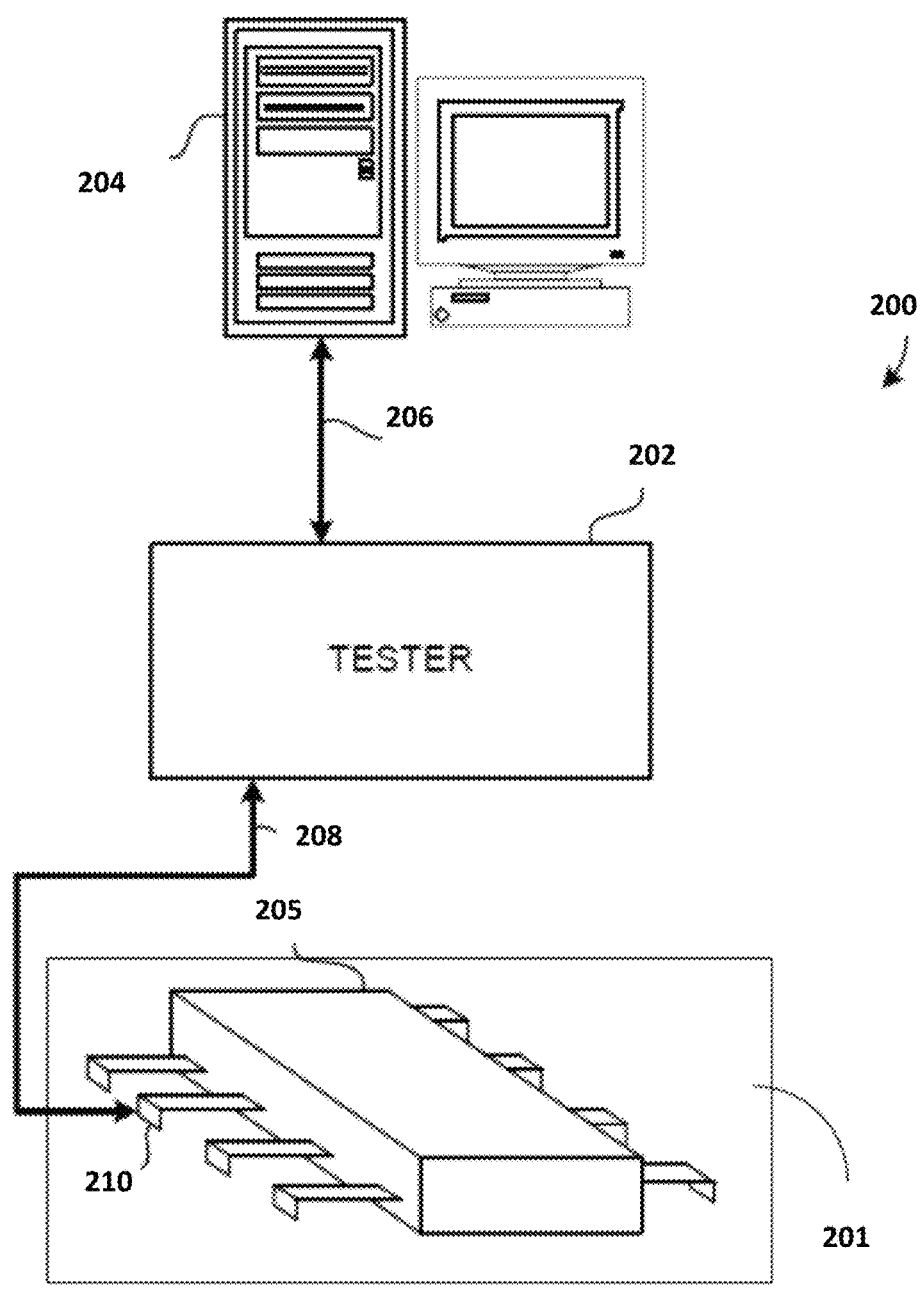
FIG. 2 is a high-level block diagram of example ATE, which may include the circuitry and components of FIG. 1.

Referring to FIG. 2, an example ATE 200 for testing a DUT 205 includes a tester (or "test instrument") 202. Tester 202 may include the circuitry described above with respect to FIG. 1. DUT 205 may be interfaced to a DIB 201, which may interface to one or more of the example instrument modules of the type described herein to send signals to, and receive signals, from the DUT.

Tester 202 may include a number of channels, each of which may be PART OF an HSD, as described above. To control tester 202, system 200 includes a computer system 204 that interfaces with tester 202 over a hardwire connection 206. In an example operation, computer system 204 sends commands to tester 202 to initiate execution of routines and functions for testing DUT 205. Such executing test routines may initiate the generation and transmission of test signals to the DUT 205 and collect responses from the DUT (e.g., via an instrument module). Various types of DUTs may be tested by system 200. In some implementations, the DUTs may be RF, microwave, or other wireless devices. In some implementations, the DUT may be any appropriate semiconductor or other device, such as an integrated circuit (IC) chip (e.g., memory chip, microprocessor, analog-to-digital converter, digital-to-analog converter, etc.) or other devices.

To provide test signals and collect responses from the DUT, tester 202 is connected to an interface to the internal circuitry of DUT 205. For example, the DUT may be inserted into a socket in DIB 201, which contains interfaces to electrical connections between the DUT and an instrument module in the tester. A conductor 208 (e.g., one or more conductive pathways) is connected to the interface and is used to deliver test signals (e.g., switching or DC test signals, etc.) to the internal circuitry of DUT 205. Conductor 208 also senses signals in response to the test signals provided by tester 202. For example, a voltage signal or a current signal may be sensed at pin 210 (e.g., by a PPMU, as described above) in response to a test signal and sent over conductor 208 to tester 202 for analysis. Such single port tests may also be performed on other pins included in DUT 205. For example, tester 202 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 208 to pin 210 for storing a digital value on DUT 205. Once stored, DUT 205 may be accessed to retrieve and send the stored digital value over conductor 208 to tester 202. The retrieved digital value may then be identified to determine if the proper value was stored on DUT 205.

Along with performing single port measurements, a two-port or multi-port test may also be performed by tester 202. For example, a test signal may be injected over conductor 208 into pin 210 and a response signal may be collected from one or more other pins of DUT 205. This response signal may be provided to tester 202 to determine quantities, such as gain response, phase response, and other throughput measurement quantities. Other tests may also be performed.

While this specification describes example implementations related to "testing" and a "test system," the devices and method described herein may be used in any appropriate system, and are not limited to test systems or to the example test systems described herein.

Testing performed as described herein may be implemented using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one location or distributed across multiple locations and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes intervening components but that nevertheless allows electrical signals (including wireless signals) to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. Automatic test equipment (ATE) comprising:
   digital circuitry to output digital test signals on a test channel to a device under test (DUT) and to receive digital response signals from the DUT;
   a per-pin measurement unit (PPMU) to output analog test signals on the test channel to the DUT and to receive analog response signals from the DUT, the PPMU and the digital circuitry being separately connected to the test channel;
   logic configured to execute a state machine to control the PPMU;
   memory that is part of, or separate from, the logic; and
   a control system to output a command to the state machine to pass to the state machine control over obtaining data from, and outputting data to, the DUT;
   wherein the state machine is configured to obtain first data that is based on the analog response signals and to store the first data in the memory; and
   wherein the digital circuitry is configured to output control data, the control data being received by the logic and being usable to control the state machine to obtain the first data in synchronism with output of the digital test signals to the DUT.

2. The ATE of claim 1, wherein the ATE is configured to test the DUT, the DUT having multiple pins; and
   wherein the first data is based on values at a single pin of the DUT.

3. The ATE of claim 1, wherein the ATE is configured to test the DUT, the DUT having multiple pins; and
   wherein the first data is based on values at multiple pins of the DUT.

4. The ATE of claim 1, further comprising:
   an analog-to-digital converter (ADC) between the logic and the PPMU, the ADC for servicing one or multiple PPMUs including the PPMU;
   wherein the state machine is configured to obtain the first data by retrieving the first data from the ADC.

5. The ATE of claim 1, wherein the ATE is configured to test the DUT, the DUT having multiple pins;
   wherein the first data is based on values at a single pin of the DUT;
   wherein the logic is configured to provide the first data to the control system; and
   wherein the control system is configured to reconstruct a waveform based on the first data.

6. The ATE of claim 1, wherein the ATE is configured to test the DUT, the DUT having multiple pins;
   wherein the first data is based on values at a single pin of the DUT; and
   wherein the first data is usable to perform one or more operations comprising measuring signal noise or extracting signal peak amplitude.

7. The ATE of claim 1, wherein the ATE is configured to control when the state machine obtains the first data or outputs second data to the PPMU from the memory.

8. The ATE of claim 7, wherein the ATE is configured to control the state machine to obtain the first data at a time that is based on the control data.

9. The ATE of claim 1, further comprising:
   a processing device that is responsive to the control system to control operation of the logic.

10. The ATE of claim 9, wherein the logic comprises a field programmable gate array (FPGA);
    wherein the ATE comprises multiple FPGAs, each of the multiple FPGAs being configured to execute a state machine to control one or more PPMUs; and
    wherein the processing device is configured to control the multiple FPGAs.

11. The ATE of claim 1, wherein the PPMU comprises a digital-to-analog converter; and
    wherein the analog test signals comprise an AC waveform that is based on second data stored in memory.

12. The ATE of claim 1, wherein the PPMU is configurable to measure or to source a current waveform, or to measure or source a voltage waveform.

13. A method of operating automatic test equipment (ATE), the method comprising:
    outputting digital test signals and control data from digital circuitry in the ATE, the digital test signals being output on a test channel to a device under test (DUT);
    outputting a command to a state machine executed by logic in the ATE, the command to pass control to the state machine over obtaining data from and outputting data to the DUT;
    receiving the control data at the logic; and
    in synchronism with output of the digital test signals to the DUT and based on the control data, executing the state machine to: (i) obtain first data that is based on analog response signals received from the DUT by a per-pin measurement unit (PPMU) in response to analog test signals sent to the DUT by the PPMU on the test channel, the PPMU and the digital circuitry being separately connected to the test channel, and (ii) store the first data in memory that is part of, or separate from, the logic.

14. One or more non-transitory machine-readable storage media storing instructions that are executable during operation of automatic test equipment (ATE) to control operations comprising:
    outputting digital test signals and control data from digital circuitry in the ATE, the digital test signals being output on a test channel to a device under test (DUT);
    outputting a command to a state machine executed in the ATE, the command to pass control to the state machine over obtaining data from and outputting data to the DUT; and
    in synchronism with output of the digital test signals to the DUT and based on the control data, executing the state machine to: (i) obtain first data that is based on analog response signals received from the DUT by a per-pin measurement unit (PPMU) in response to analog test signals sent to the DUT by the PPMU on the test channel, the PPMU and the digital circuitry being separately connected to the test channel, and (ii) store the first data in memory.

15. The one or more non-transitory machine-readable storage media of claim 14, wherein the ATE is configured to test the DUT, the DUT having multiple pins; and
    wherein the first data is based on values at a single pin of the DUT.

16. The one or more non-transitory machine-readable storage media of claim 14, wherein the ATE is configured to test the DUT, the DUT having multiple pins; and
    wherein the first data is based on values at multiple pins of the DUT.

17. The one or more non-transitory machine-readable storage media of claim 14, wherein the ATE is configured to test the DUT, the DUT having multiple pins;
    wherein the first data is based on values at a single pin of the DUT; and
    wherein the first data is usable to perform one or more operations comprising measuring signal noise or extracting signal peak amplitude.

* * * * *